(12) United States Patent
Okabe et al.

(10) Patent No.: US 12,310,169 B2
(45) Date of Patent: May 20, 2025

(54) DISPLAY DEVICE AND METHOD OF MANUFACTURING SAME

(71) Applicant: SHARP KABUSHIKI KAISHA, Sakai (JP)

(72) Inventors: Tohru Okabe, Sakai (JP); Shoji Okazaki, Sakai (JP); Ryosuke Gunji, Sakai (JP); Shinsuke Saida, Sakai (JP); Shinji Ichikawa, Sakai (JP); Tokuo Yoshida, Sakai (JP); Hiroharu Jinmura, Yonago (JP); Akira Inoue, Yonago (JP); Yoshihiro Nakada, Yonago (JP); Koji Tanimura, Yonago (JP); Yoshihiro Kohara, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 1090 days.

(21) Appl. No.: 17/264,170

(22) PCT Filed: Aug. 2, 2018

(86) PCT No.: PCT/JP2018/029087
§ 371 (c)(1),
(2) Date: Jan. 28, 2021

(87) PCT Pub. No.: WO2020/026417
PCT Pub. Date: Feb. 6, 2020

(65) Prior Publication Data
US 2021/0288286 A1 Sep. 16, 2021

(51) Int. Cl.
*H10K 50/824* (2023.01)
*G09F 9/30* (2006.01)
*H05B 33/02* (2006.01)
*H05B 33/04* (2006.01)
*H05B 33/06* (2006.01)
(Continued)

(52) U.S. Cl.
CPC ....... *H10K 50/8426* (2023.02); *H10K 50/844* (2023.02); *H10K 59/1213* (2023.02); *H10K 59/124* (2023.02); *H10K 59/131* (2023.02); *H10K 71/00* (2023.02)

(58) Field of Classification Search
CPC ........... H10K 50/8426; H10K 59/1213; H10K 59/124; H10K 59/8722; H05B 33/04
See application file for complete search history.

(56) References Cited

U.S. PATENT DOCUMENTS

2014/0117330 A1    5/2014   Cho et al.
2018/0026226 A1*   1/2018   Choi ............... H10K 59/873
                                                        257/552
2018/0102502 A1*   4/2018   Kim ............... H10K 59/8731

FOREIGN PATENT DOCUMENTS

JP    2014-086415 A    5/2014

\* cited by examiner

*Primary Examiner* — Antonio B Crite
(74) *Attorney, Agent, or Firm* — ScienBiziP, P.C.

(57) ABSTRACT

A display device includes: a sealing film provided so as to cover light-emitting elements at least partially constituting a display area and including a first inorganic film, an organic film, and a second inorganic film stacked in this order; and a first damming wall in a frame area around the display area, the first damming wall surrounding the display area and overlapping a peripheral portion of the organic film, wherein at least one inorganic insulation film in a TFT layer has an upwardly open, first opening at least in a part of an area between the display area and the first damming wall, and the organic film is provided so as to fill in the first opening.

15 Claims, 8 Drawing Sheets

(51) Int. Cl.
   *H05B 33/10* (2006.01)
   *H10K 50/842* (2023.01)
   *H10K 50/844* (2023.01)
   *H10K 59/121* (2023.01)
   *H10K 59/124* (2023.01)
   *H10K 59/131* (2023.01)
   *H10K 59/80* (2023.01)
   *H10K 71/00* (2023.01)
   *H10K 77/10* (2023.01)
   *H05B 33/22* (2006.01)

FIG.9

DISPLAY DEVICE AND METHOD OF MANUFACTURING SAME

TECHNICAL FIELD

The disclosure relates to display devices and methods of manufacturing the display devices.

BACKGROUND ART

The OLED display device, or the self-luminous display device built around OLEDs (organic light-emitting diodes), has been attracting attention as a promising successor to the liquid crystal display device. A sealing structure in which a sealing film covering the OLEDs is provided by a stack of organic and inorganic films is suggested for the OLED display device to prevent degradation of the OLEDs due to contamination by, for example, water and oxygen.

For instance, Japanese Unexamined Patent Application Publication, Tokukai, No. 2014-86415 discloses a display device that includes a sealing film having a layered structure in which inorganic films formed, for example, by CVD (chemical vapor deposition) and organic films formed, for example, by inkjet technology are alternately provided.

SUMMARY

Technical Problem

In the formation of an organic film in the sealing film by inkjet technology as in the display device disclosed in Japanese Unexamined Patent Application Publication, Tokukai, No. 2014-86415, it is necessary to provide a damming wall in the frame area surrounding the display area where the OLEDs are provided, in order to dam up the ink that will become the organic film. If the damming wall is located in the frame area and separated from the periphery of the display area by an increasing distance, the damming wall can dam up increasing amounts of ink. That indeed improves the ink-damming effect of the damming wall, but adds to the width of the frame area. The structure therefore has room for improvement.

In view of the foregoing problems, it is an object of the disclosure to improve the ink-damming effect of the damming wall without adding much to the width of the frame area.

Solution to Problem

To achieve this object, the disclosure is directed to a display device including: a base substrate; a TFT layer on the base substrate, the TFT layer including at least one inorganic insulation film and at least one planarization film stacked in this order; light-emitting elements on the TFT layer, the light-emitting elements at least partially constituting a display area; a sealing film provided so as to cover the light-emitting elements and including a first inorganic film, an organic film, and a second inorganic film stacked in this order; and a first damming wall in a frame area around the display area, the first damming wall surrounding the display area and overlapping a peripheral portion of the organic film, wherein the at least one inorganic insulation film has an upwardly open, first opening at least in a part of an area between the display area and the first damming wall, and the organic film is provided so as to fill in the first opening.

Advantageous Effects of Disclosure

The disclosure provides: an upwardly open, first opening through at least one inorganic insulation film in a TFT layer at least in a part of an area between the display area and the first damming wall; and an organic film provided in a sealing film so as to fill in the first opening. The disclosure can therefore improve the ink-damming effect of the first damming wall without adding much to the width of the frame area.

DESCRIPTION OF EMBODIMENTS

The following will describe embodiments of the disclosure in detail in reference to drawings. The present invention disclosure is not limited by the embodiments below.

First Embodiment

Figure 1:
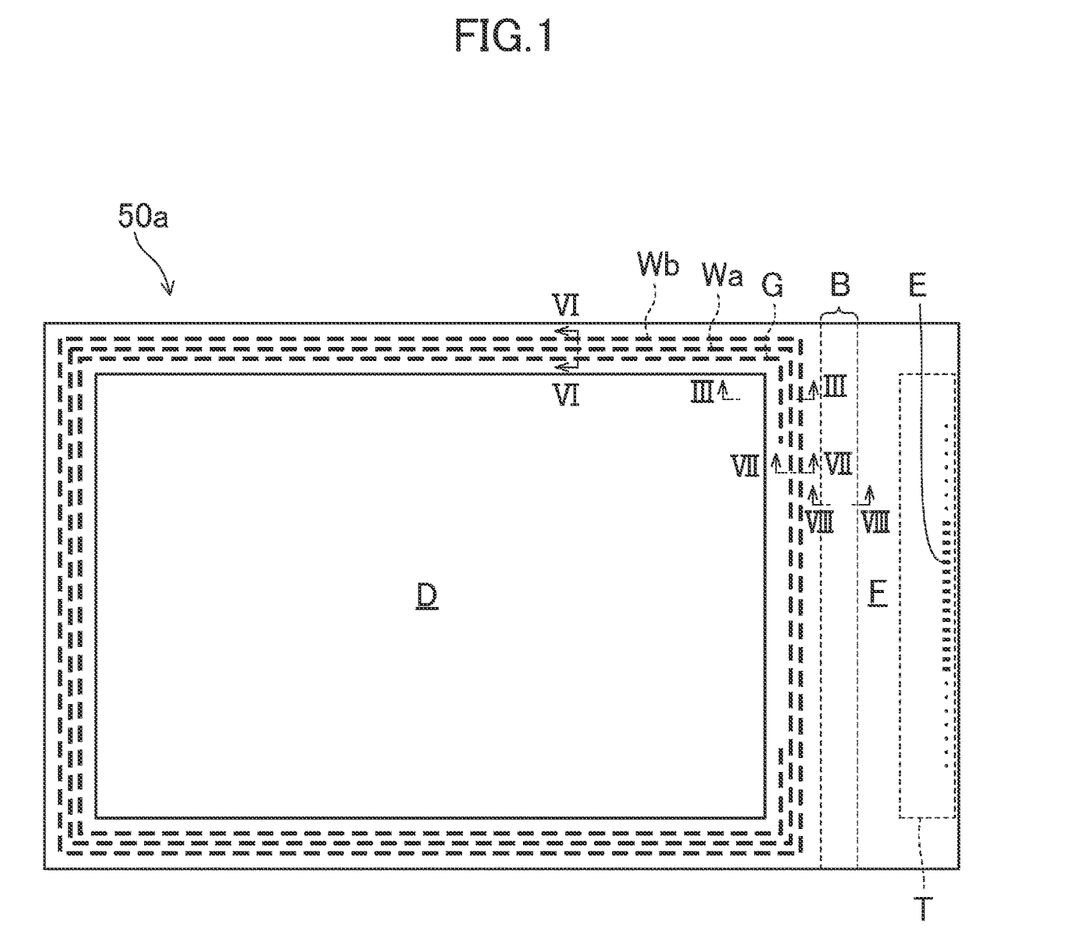
FIG. 1 is a schematic plan view of a structure of an OLED display device in accordance with a first embodiment.
Figure 2:
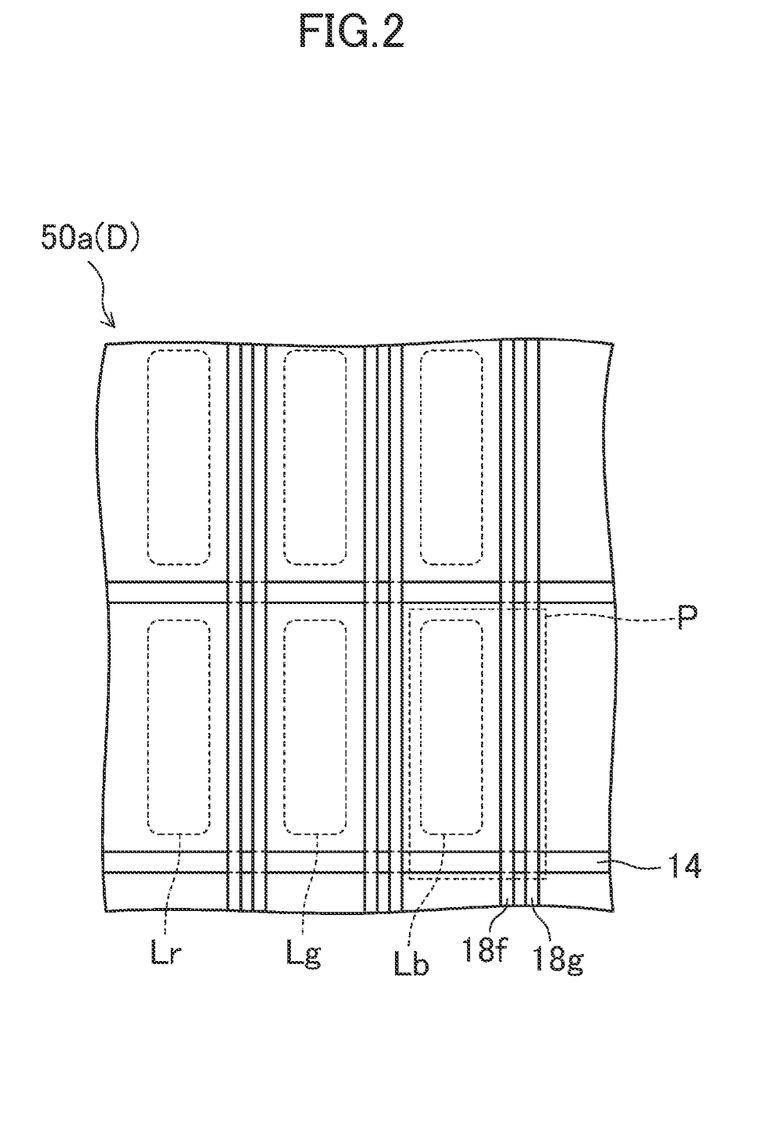
FIG. 2 is a plan view of a display area of the OLED display device in accordance with the first embodiment.
Figure 3:
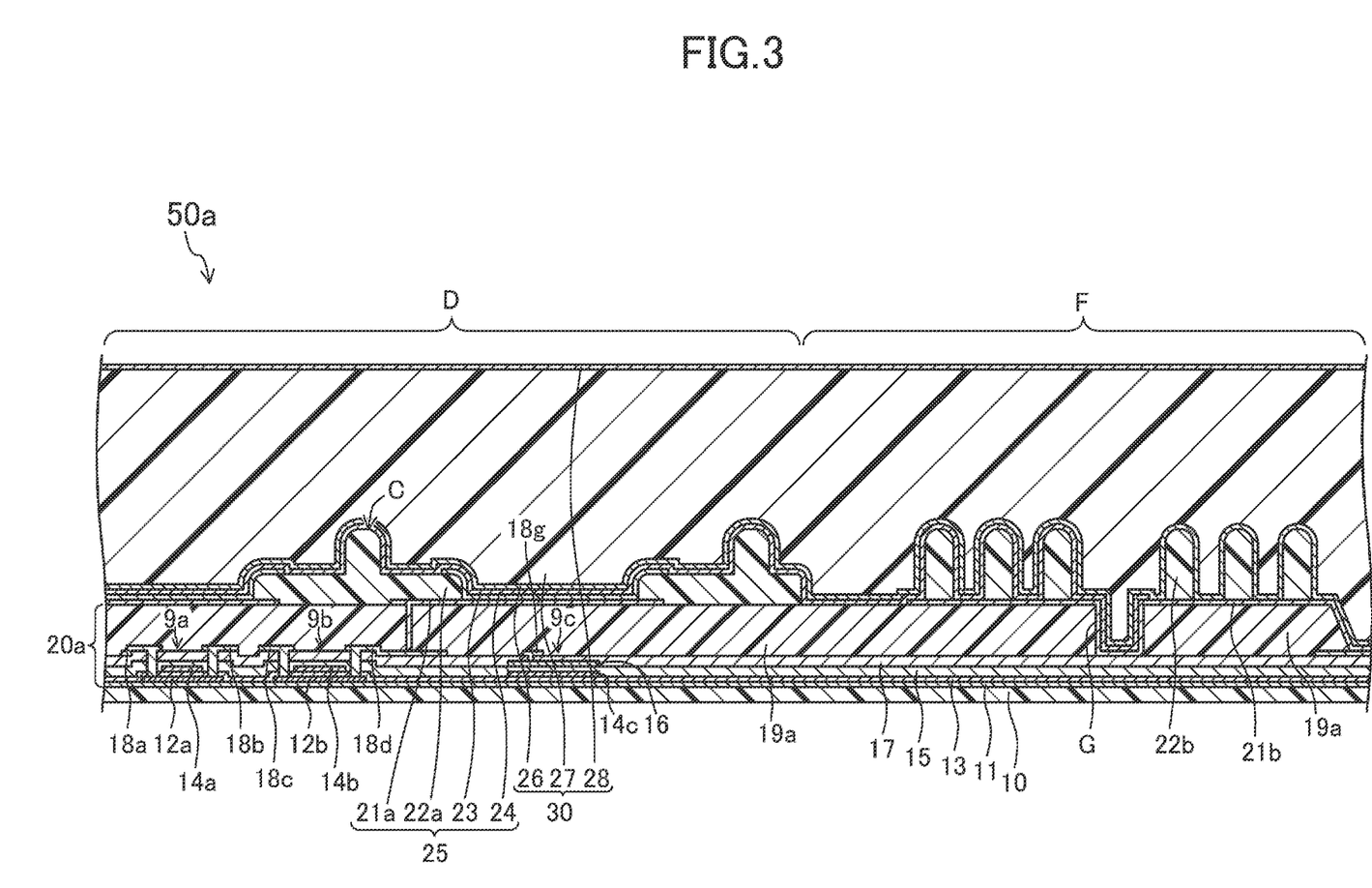
FIG. 3 is a cross-sectional view of the OLED display device taken along line III-III shown in FIG. 1.
Figure 4:
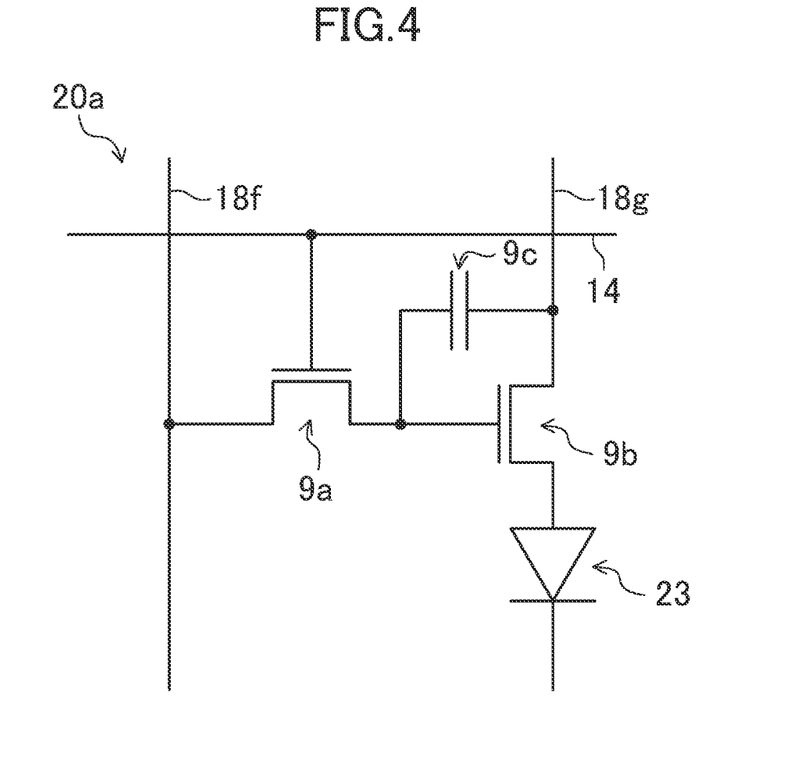
FIG. 4 is an equivalent circuit diagram of a TFT layer in the OLED display device in accordance with the first embodiment.
Figure 5:
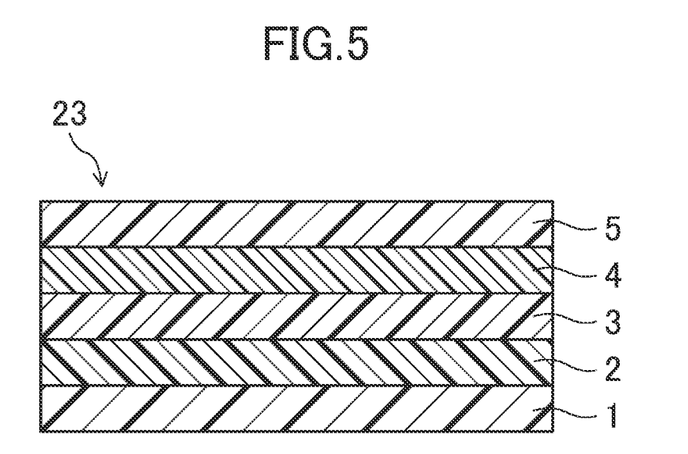
FIG. 5 is a cross-sectional view of an organic light-emitting layer in the OLED display device in accordance with the first embodiment.
Figure 6:
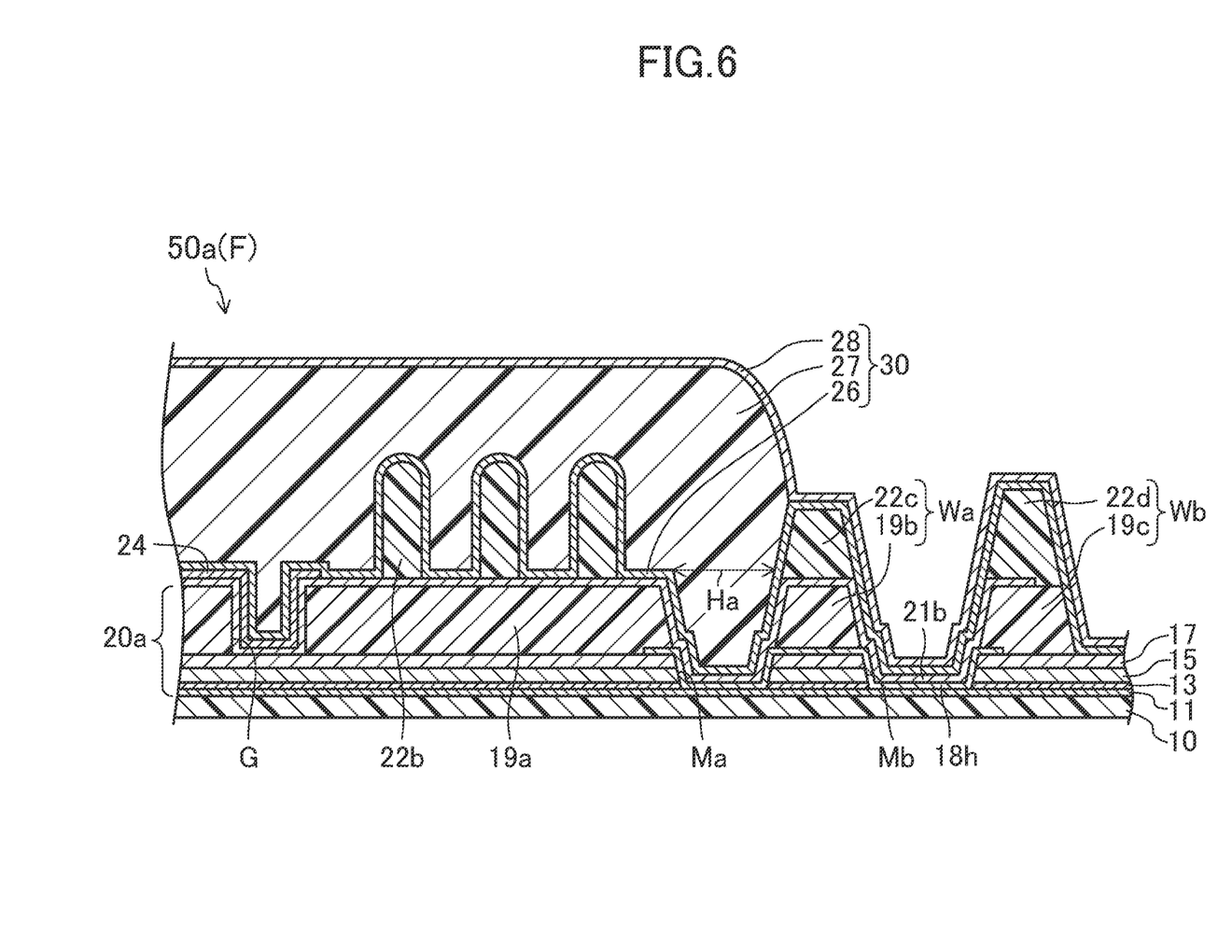
FIG. 6 is a cross-sectional view of a frame area of the OLED display device taken along line VI-VI shown in FIG. 1.
Figure 7:
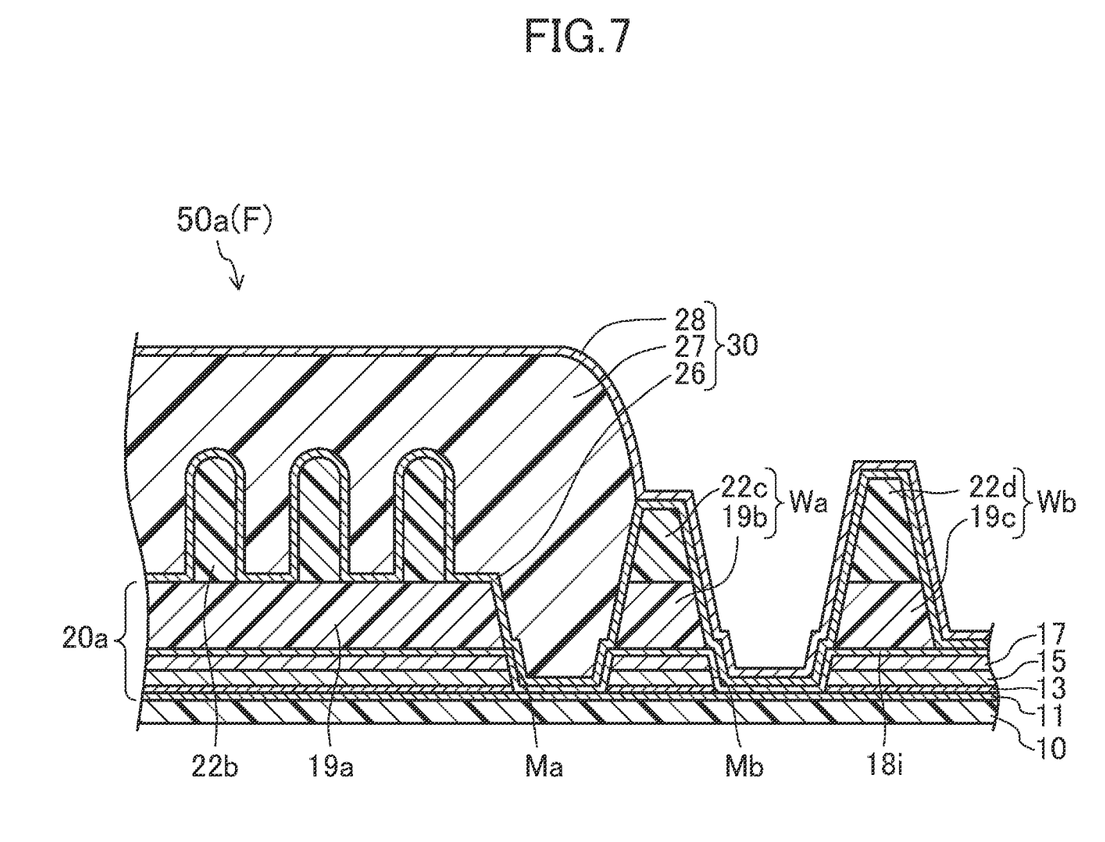
FIG. 7 is a cross-sectional view of the frame area of the OLED display device taken along line VII-VII shown in FIG. 1.
Figure 8:
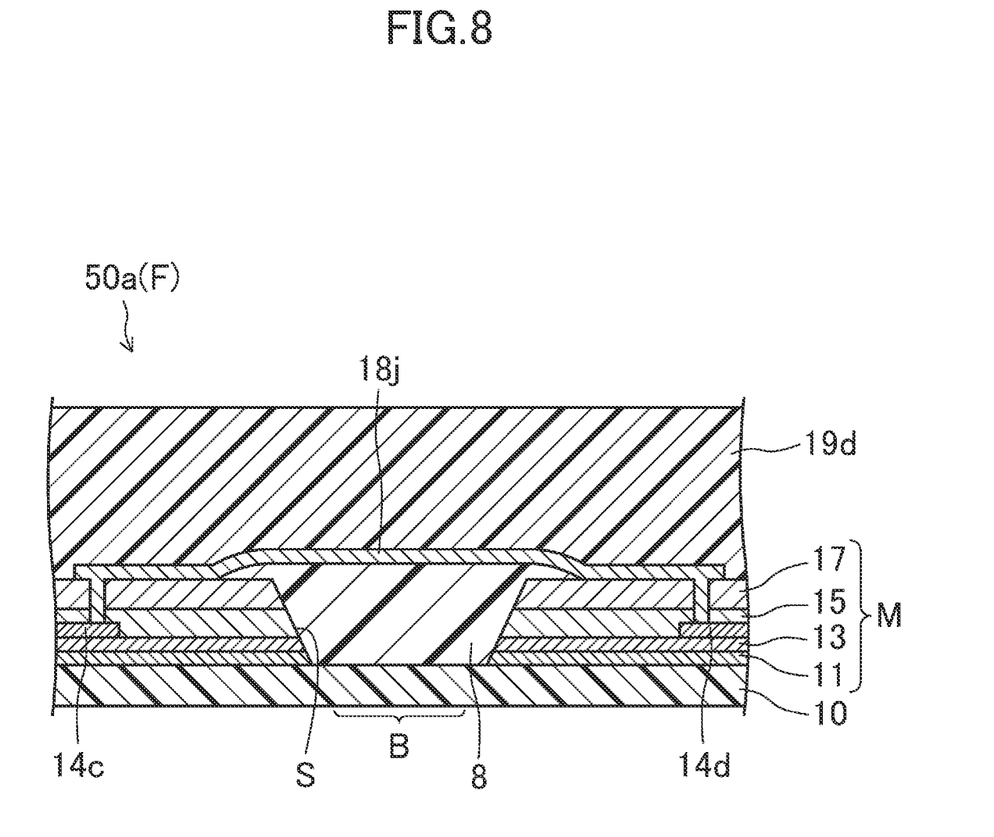
FIG. 8 is a cross-sectional view of a bending portion in the frame area of the OLED display device taken along line VIII-VIII shown in FIG. 1.

FIGS. 1 to 8 illustrate a first embodiment of the display device and the method of manufacturing the display device. The current and subsequent embodiments will discuss OLED display devices including OLEDs as an example of the display device that includes light-emitting elements. FIG. 1 is a schematic plan view of a structure of an OLED display device 50a in accordance with the present embodiment. FIG. 2 is a plan view of a display area D of the OLED display device 50a. FIG. 3 is a cross-sectional view of the OLED display device 50a taken along line III-III shown in FIG. 1. FIG. 4 is an equivalent circuit diagram of a TFT layer 20a in the OLED display device 50a. FIG. 5 is a cross-sectional view of an organic light-emitting layer 23 in the OLED display device 50a. FIGS. 6, 7, and 8 are cross-sectional views of a bending portion B in a frame area F of the OLED display device 50a taken along lines VI-VI, VII-VII, and VIII-VIII shown in FIG. 1 respectively.

The OLED display device 50a, as shown in FIG. 1, has, for example, the rectangular display area D for displaying an image and the frame area F surrounding the display area D. The present embodiment will discuss the rectangular display area D as an example. Alternatively, the display area D may not be exactly rectangular and have, for example, an arched side or a round corner. In addition, the display area D and the frame area F are not necessarily geometrically similar.

In the display area D is there provided a matrix of subpixels P as shown in FIG. 2. Also in the display area D, for example, a subpixel P including a red-light-emitting region Lr for a display in red, a subpixel P including a green-light-emitting region Lg for a display in green, and a subpixel P including a blue-light-emitting region Lb for a display in blue are provided adjacent to each other as shown in FIG. 2. Each pixel in the display area D is formed by, for example, three adjacent subpixels P including a red-light-emitting region Lr, a green-light-emitting region Lg, and a blue-light-emitting region Lb respectively.

Referring to FIG. 1, the frame area F includes a terminal section T on the right side thereof. The terminal section T includes a plurality of terminals E. Still referring to FIG. 1, the frame area F further includes the bending portion B extending in one direction (vertical direction in FIG. 1) between the display area D and the terminal section T. The bending portion B can be bent by, for example, 180° along a vertical line in FIG. 1 (to form a U-shape). The frame area F further includes a generally C-shaped trench G through a second planarization film 19a (detailed later) as shown in FIGS. 1, 3, and 6. The trench G is shaped generally like the letter C and positioned in a plan view so as to be open on the side thereof facing the terminal section T as shown in FIG. 1. The present embodiment discusses, as an example, the bending portion B residing in the frame area F. Alternatively, there may be provided no bending portion at all, in which case the display-use lines (e.g., gate lines 14 and source lines 18f (detailed later)) in the display area D may be electrically connected directly to the respective terminals E of the terminal section T.

The OLED display device 50a, as shown in FIG. 3, includes a resin substrate layer 10, the TFT (thin film transistor) layer 20a, OLEDs 25, and a sealing film 30. The resin substrate layer 10 serves as a base substrate. The TFT layer 20a resides on the resin substrate layer 10. The OLEDs 25 reside on the TFT layer 20a as light-emitting elements forming the display area D. The sealing film 30 covers the OLEDs 25.

The resin substrate layer 10 is made of, for example, a polyimide resin.

The TFT layer 20a includes: a base coat film 11 on the resin substrate layer 10; a plurality of first TFTs 9a, a plurality of second TFTs 9b, and a plurality of capacitors 9c on the base coat film 11; and the second planarization film 19a on the first TFTs 9a, the second TFTs 9b, and the capacitors 9c, as shown in FIG. 3. There is provided a first planarization film 8 in the bending portion B of the frame area F as will be detailed later in detail. The TFT layer 20a contains therein the gate lines 14 that extend parallel to each other in the lateral direction in the figure as shown in FIGS. 2 and 4. The TFT layer 20a further contains therein the source lines 18f that extend parallel to each other in the vertical direction in the figure as shown in FIGS. 2 and 4. The TFT layer 20a further contains therein a plurality of power supply lines 18g that extend parallel to each other in the vertical direction in the figure as shown in FIGS. 2 and 4. Each power supply line 18g is adjacent to one of the source lines 18f as shown in FIG. 2. The TFT layer 20a contains the first TFTs 9a, the second TFTs 9b, and the capacitors 9c, one each in every subpixel P as shown in FIG. 4.

The base coat film 11 includes either a single inorganic insulation film of, for example, silicon nitride, silicon oxide, or silicon oxynitride or a stack of any of these inorganic insulation films.

Each first TFT 9a is connected to an associated one of the gate lines 14 and an associated one of the source lines 18f in the subpixel P as shown in FIG. 4. The first TFT 9a includes a semiconductor layer 12a, a gate insulation film 13, a gate electrode 14a, a first interlayer insulation film 15, a second interlayer insulation film 17, a source electrode 18a, and a drain electrode 18b that are provided on the base coat film 11 in this order as shown in FIG. 3. The semiconductor layer 12a is provided in an insular manner on the base coat film 11 as shown in FIG. 3 and includes channel regions, source regions, and drain regions. The gate insulation film 13 is provided so as to cover the semiconductor layer 12a as shown in FIG. 3. The gate electrode 14a is provided on the gate insulation film 13 so as to overlap the channel region in the semiconductor layer 12a as shown in FIG. 3. The first interlayer insulation film 15 and the second interlayer insulation film 17 are provided in this order so as to cover the gate electrodes 14a as shown in FIG. 3. The source electrode 18a and the drain electrode 18b are provided on the second interlayer insulation film 17 so as to be separated from each other as shown in FIG. 3. The source electrode 18a and the drain electrode 18b are connected respectively to a source region and a drain region in the semiconductor layer 12a via contact holes formed through the stack of the gate insulation film 13, the first interlayer insulation film 15, and the second interlayer insulation film 17, as shown in FIG. 3. The gate insulation film 13, the first interlayer insulation film 15, and the second interlayer insulation film 17 each include either a single inorganic insulation film of, for example, silicon nitride, silicon oxide, or silicon oxynitride or a stack of any of these inorganic insulation films.

Each second TFT 9b is connected to an associated one of the first TFTs 9a and an associated one of the power supply lines 18g in the subpixel P as shown in FIG. 4. The second TFT 9b includes: a semiconductor layer 12b, the gate insulation film 13, gate electrodes 14b, the first interlayer insulation film 15, the second interlayer insulation film 17, source electrodes 18c, and drain electrodes 18d that are provided on the base coat film 11 in this order as shown in FIG. 3. The semiconductor layer 12b is provided in an insular manner on the base coat film 11 as shown in FIG. 3 and includes channel regions, source regions, and drain regions. The gate insulation film 13 is provided so as to cover the semiconductor layer 12b as shown in FIG. 3. The gate electrode 14b is provided on the gate insulation film 13 so as to overlap a channel region in the semiconductor layer 12b as shown in FIG. 3. The first interlayer insulation film 15 and the second interlayer insulation film 17 are provided in this order so as to cover the gate electrodes 14b as shown in FIG. 3. The source electrode 18c and the drain electrode 18d are provided on the second interlayer insulation film 17 so as to be separated from each other as shown in FIG. 3. The source electrode 18c and the drain electrode 18d are connected respectively to a source region and a drain region in the semiconductor layer 12b via contact holes formed through the stack of the gate insulation film 13, the first interlayer insulation film 15, and the second interlayer insulation film 17, as shown in FIG. 3.

The first TFTs 9a and the second TFTs 9b are top-gate TFTs in the present embodiment, but may alternatively be bottom-gate TFTS.

Each capacitor 9c is connected to an associated one of the first TFTs 9a and an associated one of the power supply lines 18g in the subpixel P as shown in FIG. 4. The capacitor 9c includes: a lower conductive layer 14c made of the same material and in the same layer as the gate electrodes 14a and 14b; the first interlayer insulation film 15 provided so as to cover the lower conductive layer 14c; and an upper conductive layer 16 provided on the first interlayer insulation film 15 so as to overlap the lower conductive layer 14c, as shown in FIG. 3. The upper conductive layer 16 is electrically connected to the power supply line 18g via a contact hole formed through the second interlayer insulation film 17, as shown in FIG. 3.

The second planarization film 19a has a flat surface in the display area D and is made of, for example, an organic resin material such as a polyimide resin.

The OLEDs 25 include a plurality of first electrodes 21a, an edge cover 22a, the organic light-emitting layers 23, and a plurality of second electrodes 24 that are provided on the second planarization film 19a in this order as shown in FIG. 3.

The first electrodes 21a are associated with the respective subpixels P and arranged in a matrix as pixel electrodes on the second planarization film 19a as shown in FIG. 3. Each first electrode 21a is connected to the drain electrode 18d of the second TFT 9b via a contact hole formed through the second planarization film 19a as shown in FIG. 3. The first electrodes 21a have a function of injecting holes to the organic light-emitting layer 23. The first electrodes 21a are preferably formed of a material that has a large work function in order to improve the efficiency of hole injection to the organic light-emitting layer 23. The first electrodes 21a are made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). The first electrodes 21a may alternatively be made of, for example, an alloy such as astatine-astatine oxide (At—$AtO_2$). As another alternative, the first electrodes 21a may be made of, for example, an electrically conductive oxide such as tin oxide (SnO), zinc oxide (ZnO), indium tin oxide (ITO), or indium zinc oxide (IZO). As a further alternative, the first electrodes 21a may be a stack of layers of any of these materials. Examples of compound materials that have a large work function include indium tin oxide (ITO) and indium zinc oxide (IZO).

The edge cover 22a is arranged to form a lattice covering the peripheral portions of the first electrodes 21a as shown in FIG. 3. The edge cover 22a may be made of an organic film of, for example, polyimide resin, acrylic resin, polysiloxane resin, or novolac resin. Parts of the surface of the edge cover 22a protrude upwards as shown in FIG. 3, to provide insular pixel photo spacers C.

The organic light-emitting layers 23, one for each subpixel P, are arranged in a matrix on the first electrodes 21a as shown in FIG. 3. Each organic light-emitting layer 23 includes a hole injection layer 1, a hole transport layer 2, a light-emitting layer 3, an electron transport layer 4, and an electron injection layer 5 that are provided on the first electrodes 21a in this order as shown in FIG. 5.

The hole injection layer 1, alternatively referred to as the anode buffer layer, has a function of bringing the energy levels of the first electrode 21a and the organic light-emitting layer 23 closer to each other to improve the efficiency of hole injection from the first electrode 21a to the organic light-emitting layer 23. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 has a function of improving the efficiency of hole transport from the first electrode 21a to the organic light-emitting layer 23. The hole transport layer 2 is made of, for example, a porphyrin derivative, an aromatic tertiary amine compound, a styrylamine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zine selenide.

The light-emitting layer 3 is injected with holes and electrons from the first electrode 21a and the second electrode 24 respectively when the light-emitting layer 3 is under the voltage applied by the first electrode 21a and the second electrode 24. These injected holes and electrons recombine in the light-emitting layer 3. The light-emitting layer 3 is made of a material that has a high light-emitting efficiency. The light-emitting layer 3 is made of, for example, a metal oxinoid compound [8-hydroxy quinoline metal complex], a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 24 and the organic light-emitting layer 23 closer to each other to improve the efficiency of electron injection from the second electrode 24 to the organic light-emitting layer 23. This function can lower the drive voltage of the OLED 25. The electron injection layer 5, alternatively referred to as the cathode buffer layer, is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 24 serves as a common electrode so as to cover the organic light-emitting layer 23 and the edge cover 22a as shown in FIG. 3. The second electrode 24 has a function of injecting electrons to the organic light-emitting layer 23. The second electrode 24 is more preferably made of a material that has a small work function in order to improve the efficiency of electron injection to the organic light-emitting layer 23. The second electrode 24 is made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF), The second electrode 24 may alternatively be made of, for example, a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 24 may be made of, for example, an electrically conductive oxide such as tin oxide (SnO), zinc oxide (ZnO), indium tin oxide (ITO), or indium zinc oxide (IZO). As a further alternative, the second electrode 24 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 30 includes: a first inorganic film 26 provided so as to cover the second electrodes 24; an organic film 27 on the first inorganic film 26; and a second inorganic film 28 provided so as to cover the organic film 27, as shown in FIG. 3. The sealing film 30 has a function of protecting the organic light-emitting layer 23 from, for example, water and oxygen. The first inorganic film 26 and the second inorganic film 28 are made of, for example, an inorganic material such as silicon oxide (SiO$_2$), aluminum oxide (Al$_2$O$_3$), silicon nitride (SiNx, where x is a positive number) (e.g., trisilicon tetranitride (Si$_3$N$_4$)), or silicon carbide nitride (SiCN). The organic film 27 is made of, for example, an organic material such as an acrylic resin, a polyurea resin, a parylene resin, a polyimide resin, or a polyamide resin.

The OLED display device 50a includes in the frame area F: a frame-shaped, first damming wall Wa provided so as to surround the display area D and to overlap a peripheral portion of the organic film 27 in the sealing film 30; and a frame-shaped, second damming wall Wb around the first damming wall Wa, as shown in FIGS. 1, 6, and 7.

The first damming wall Wa includes: an underlying resin layer 19b made of the same material and in the same layer as the second planarization film 19a; and an overlying resin layer 22c made of the same material and in the same layer as the edge cover 22a, as shown in FIGS. 6 and 7. The overlying resin layer 22c resides on the underlying resin layer 19b with a conductive layer 21b (detailed later) intervening therebetween. A frame-shaped, first opening Ma is formed through the gate insulation film 13, the first interlayer insulation film 15, and the second interlayer insulation film 17 between the display area D and the first damming wall Wa as shown in FIGS. 6 and 7. The first opening Ma is open upwards. The organic film 27 in the sealing film 30 is provided so as to fill in the inside of the first opening Ma. The first opening Ma in the present embodiment is shaped like a frame. Alternatively, the first opening Ma may be provided at least in a part of the area between the display area D and the first damming wall Wa. The first opening Ma in the present embodiment is provided through the stack of the gate insulation film 13, the first interlayer insulation film 15, and the second interlayer insulation film 17, as an example. Alternatively, the first opening Ma may be provided through the stack of the first interlayer insulation film 15 and the second interlayer insulation film 17 or through the second interlayer insulation film 17.

The second damming wall Wb includes: an underlying resin layer 19c made of the same material and in the same layer as the second planarization film 19a; and an overlying resin layer 22d made of the same material and in the same layer as the edge cover 22a, as shown in FIGS. 6 and 7. The overlying resin layer 22d resides on the underlying resin layer 19c with the conductive layer 21b intervening therebetween. A frame-shaped, second opening Mb is formed through the gate insulation film 13, the first interlayer insulation film 15, and the second interlayer insulation film 17 between the first damming wall Wa and the second damming wall Wb as shown in FIGS. 6 and 7. The second opening Mb is open upwards. The second opening Mb in the present embodiment is shaped like a frame. Alternatively, the second opening Mb may be provided at least in a part of the area between the first damming wall Wa and the second damming wall Wb. The second opening Mb in the present embodiment is provided through the stack of the gate insulation film 13, the first interlayer insulation film 15, and the second interlayer insulation film 17, as an example. Alternatively, the second opening Mb may be provided through the stack of the first interlayer insulation film 15 and the second interlayer insulation film 17 or through the second interlayer insulation film 17.

The first opening Ma and the second opening Mb are provided in such a manner that the base coat film 11 is exposed out of the gate insulation film 13, the first interlayer insulation film 15, and the second interlayer insulation film 17 as shown in FIGS. 6 and 7. The base coat film 11 is in contact with the first inorganic film 26 in the sealing film 30 via the first opening Ma and the second opening Mb. FIGS. 6 and 7 show a frame line 18h, the conductive layer 21b, and one of routing lines 18i (detailed later) in the first opening Ma and the second opening Mb between the base coat film 11 and the first inorganic film 26. In areas where none of the frame line 18h, the conductive layer 21b, and the routing lines 18i is provided, the base coat film 11 is in contact with the first inorganic film 26.

The OLED display device 50a includes the frame line 18h outside the trench G in the frame area F as shown in FIG. 6. The frame line 18h is shaped generally like the letter C in a plan view. The frame line 18h is connected to one of the terminals E of the terminal section T via, for example, one of routing lines 18j (detailed later) residing in the bending portion B, so that the frame line 18h can receive a low power supply voltage from the terminal section T. The frame line 18h is electrically connected also to the conductive layer 21b as shown in FIG. 6. The conductive layer 21b is electrically connected to the second electrodes 24 via the trench G as shown in FIG. 6. The frame line 18h is made of the same material and in the same layer as the source line 18f. The conductive layer 21b is made of the same material and in the same layer as the first electrode 21a. In the trench G are there provided other frame lines (not shown) that are connected to the terminals E of the terminal section T via, for example, the routing lines 18j residing in the bending portion B, so that these frame lines can receive a high power supply voltage from the terminal section T, The frame lines are electrically connected also to the power supply lines 18g in a part of the frame area F close to the display area D. On both sides of the trench G are there provided, among other components, TFTs that at least partially constitute a gate driver.

The OLED display device 50a includes a plurality of insular peripheral photo spacers 22b projecting upwards between the display area D and the first damming wall Wa in the frame area F as shown in FIGS. 3 and 6. The peripheral photo spacers 22b are made of the same material and in the same layer as the edge cover 22a. The peripheral photo spacers 22b have the same height above the resin substrate layer 10 as the pixel photo spacers C above the resin substrate layer 10. This height exceeds the heights of the first damming wall Wa and the second damming wall Wb above the resin substrate layer 10 as shown in FIG. 6. The height of the first damming wall Wa above the resin substrate layer 10 is smaller than the height of the second damming wall Wb above the resin substrate layer 10 as shown in FIG. 6.

The OLED display device 50a includes the routing lines 18i on one of the sides of the frame area F that faces the terminal section T (shown close to the terminal section T in the right-hand side of FIG. 1) as shown in FIG. 7. The routing lines 18i extend parallel to each other in a direction perpendicular to the first opening Ma and the second opening Mb. The routing lines 18i are electrically connected to the respective source lines 18f. The routing lines 18i are in contact with the base coat film 11 and the first inorganic film 26 on one of the sides of the first opening Ma and the second opening Mb that faces the terminal section T as shown in FIG. 7. The routing lines 18i are connected to the terminals E of the terminal section T via, for example, the routing lines 18j residing in the bending portion B. In other words, the source lines 18f are electrically connected respectively to the terminals E via the routing lines 18i. The routing lines 18i are made of the same material and in the same layer as, for example, the source lines 18f.

The OLED display device 50a includes: the first planarization film 8 provided in the bending portion B so as to fill in a slit S in the gate insulation film 13, the first interlayer insulation film 15, and the second interlayer insulation film 17; the routing lines 18j on the first planarization film 8 and the second interlayer insulation film 17; and a wiring cover layer 19d provided so as to cover the routing lines 18j, as shown in FIG. 8.

The slit S is shaped like a groove passing through the gate insulation film 13, the first interlayer insulation film 15, and the second interlayer insulation film 17 in the direction in which the bending portion B is extended, so as to expose the top face of the base coat film 11, as shown in FIG. 8.

The first planarization film 8 is made of, for example, an organic resin material such as a polyimide resin.

The routing lines 18j extend parallel to each other in a direction perpendicular to the direction in which the bending portion B is extended. Each routing line 18j has the ends thereof electrically connected respectively to a first gate conductive layer 14c and a second gate conductive layer 14d via contact holes formed through the stack of the first interlayer insulation film 15 and the second interlayer insulation film 17 as shown in FIG. 8. The routing lines 18j are made of the same material and in the same layer as, for example, the source lines 18f. The first gate conductive layer 14c is electrically connected to the signal lines running between the gate insulation film 13 and the first interlayer insulation film 15 in the display area D (e.g., the gate lines 14, the source lines 18f, and the power supply lines 18g) via, for example, the routing lines 18i as shown in FIG. 8. The second gate conductive layer 14d resides between the gate insulation film 13 and the first interlayer insulation film 15 and extends to the terminal section T to be electrically connected to the terminals E of the terminal section T. The wiring cover layer 19d is made of the same material and in the same layer as the second planarization film 19a, as shown in FIG. 8.

The OLED display device 50a described above is arranged, in each subpixel P, to turn on the first TFT 9a by inputting a gate signal to the first TFT 9a via the gate line 14 and to apply a prescribed voltage corresponding to a source signal to the gate electrode 14b and the capacitor 9c of the second TFT 9b via the source line 18f, to specify the magnitude of the current from the power supply line 18g on the basis of the gate voltage of the second TFT 9b, so that the specified current is fed to the organic light-emitting layer 23, thereby causing the light-emitting layer 3 in the organic light-emitting layer 23 to emit light to produce an image display. In the OLED display device 50a, the gate voltage of the second TFT 9b is retained by the capacitor 9c when the first TFT 9a is turned off. The light-emitting layer 3 therefore continuously emits light until another gate signal is inputted in the next frame.

Next will be described a method of manufacturing the OLED display device 50a in accordance with the present embodiment. The method of manufacturing the OLED display device 50a in accordance with the present embodiment includes a TFT layer forming step, an OLED forming step, and a sealing film forming step. The TFT layer forming step includes an opening forming step.

TFT Layer Forming Step

The TFT layer 20a is formed, for example, by forming the base coat film 11, the first TFTs 9a, the second TFTs 9b, the capacitors 9c, and the second planarization film 19a on the surface of the resin substrate layer 10 on a glass substrate by a well-known method.

To form the first TFTs 9a and the second TFTs 9b, the first opening Ma, the second opening Mb, and the slit S are formed by removing the stack of the gate insulation film 13, the first interlayer insulation film 15, and the second interlayer insulation film 17 in the frame area F by dry etching before, for example, the source lines 18f are formed. The first planarization film 8 is then formed so as to fill in the slit S. Thereafter, the frame line 18h and the routing lines 18i and 18j are simultaneously formed in the formation of, for example, the source lines 18f. The underlying resin layers 19b and 19c and the wiring cover layer 19d are simultaneously formed in the formation of the second planarization film 19a.

OLED Forming Step

The first electrodes 21a, the edge cover 22a, the organic light-emitting layer 23 (the hole injection layer 1, the hole transport layer 2, the light-emitting layer 3, the electron transport layer 4, and the electron injection layer 5), and the second electrodes 24 are formed by a well-known method on the second planarization film 19a in the TFT layer 20a formed in the TFT layer forming step, to form the OLEDs 25. The conductive layer 21b is formed simultaneously with the first electrodes 21a. The peripheral photo spacers 22b and the overlying resin layers 22c and 22d are simultaneously formed by grayscale exposure using a grayscale mask such as a halftone mask or a gray tone mask, to form the edge cover 22a (including the pixel photo spacers C).

Sealing Film Forming Step

First, an inorganic insulation film such as a silicon nitride film, a silicon oxide film, or a silicon oxynitride film is formed, by plasma CVD (chemical vapor deposition) using a mask, on the surface of the substrate now carrying the OLEDs 25 formed thereon in the OLED forming step, to form the first inorganic film 26.

Subsequently, a film of an organic resin material such as an acrylic resin is formed, for example, by inkjet technology, on the surface of the substrate now carrying the first inorganic film 26 formed thereon, to form the organic film 27.

Furthermore, an inorganic insulation film such as a silicon nitride film, a silicon oxide film, or a silicon oxynitride film is formed, by plasma CVD using a mask, on the substrate now carrying the organic film 27 formed thereon, to form the second inorganic film 28, which completes the formation of the sealing film 30.

Finally, after a protection sheet (not shown) is attached to the surface of the substrate now carrying the sealing film 30 formed thereon, a laser beam is projected onto the glass substrate on the resin substrate layer 10 to detach the glass substrate from the bottom face of the resin substrate layer 10. A protection sheet (not shown) is then attached to the bottom face of the resin substrate layer 10 from which the glass substrate has been detached.

The OLED display device 50a in accordance with the present embodiment is manufactured by these steps.

As described in the foregoing, according to the OLED display device 50a and the method of manufacturing the OLED display device 50a in accordance with the present embodiment, first opening Ma is formed through the gate insulation film 13, the first interlayer insulation film 15, and the second interlayer insulation film 17 in the TFT layer 20a between the display area D and the first damming wall Wa, and the organic film 27 in the sealing film 30 is provided so as to fill in the inside of the first opening Ma. This particular structure increases the amount of the ink dammed up by the first damming wall Wa to form the organic film 27 by as much as the volume of the first opening Ma. The structure hence restrains the frame area F from increasing in width and improves the ink-damming effect of the first damming wall Wa.

Additionally, according to the OLED display device 50a and the method of manufacturing the OLED display device 50a in accordance with the present embodiment, the upwardly open, second opening Mb is formed through the gate insulation film 13, the first interlayer insulation film 15, and the second interlayer insulation film 17 in the TFT layer 20a between the first damming wall Wa and the second damming wall Wb. This particular structure increases the amount of the ink dammed up by the second damming wall Wb to form the organic film 27 by as much as the volume of the second opening Mb. The structure hence improves the ink-damming effect of the second damming wall Wb.

In addition, according to the OLED display device 50a and the method of manufacturing the OLED display device 50a in accordance with the present embodiment, the first opening Ma and the second opening Mb are provided, which unfailingly delivers the ink-damming effect thereof even when the heights of the first damming wall Wa and the second damming wall Wb are smaller than the heights of the peripheral photo spacers 22b and the pixel photo spacers C. This particular structure hence allows reductions in the heights of the peripheral photo spacers 22b and the pixel photo spacers C while ensuring the ink-damming effect of the first opening Ma and the second opening Mb. The structure can therefore readily improve vapor deposition precision, that is, precision of the formation of, for example, the light-emitting layer 3.

Meanwhile, according to the OLED display device 50a and the method of manufacturing the OLED display device 50a in accordance with the present embodiment, the first damming wall Wa and the second damming wall Wb are lower than the peripheral photo spacers 22b and the pixel photo spacers C with which the vapor deposition mask comes into contact in the formation of, for example, the light-emitting layer 3. This particular structure prevents the vapor deposition mask from coming into contact with the first damming wall Wa and the second damming wall Wb, thereby reducing the generation of, for example, foreign objects caused by the contact.

Furthermore, according to the OLED display device 50a and the method of manufacturing the OLED display device 50a in accordance with the present embodiment, the first opening Ma and the second opening Mb expose the base coat film 11, and the base coat film 11 is in contact with the first inorganic film 26 in the sealing film 30 via the first opening Ma and the second opening Mb. This particular structure ensures that the sealing film 30 can achieve the sealing capability thereof in the first opening Ma and the second opening Mb, thereby restraining degradation of the OLEDs 25.

Second Embodiment

Figure 9:
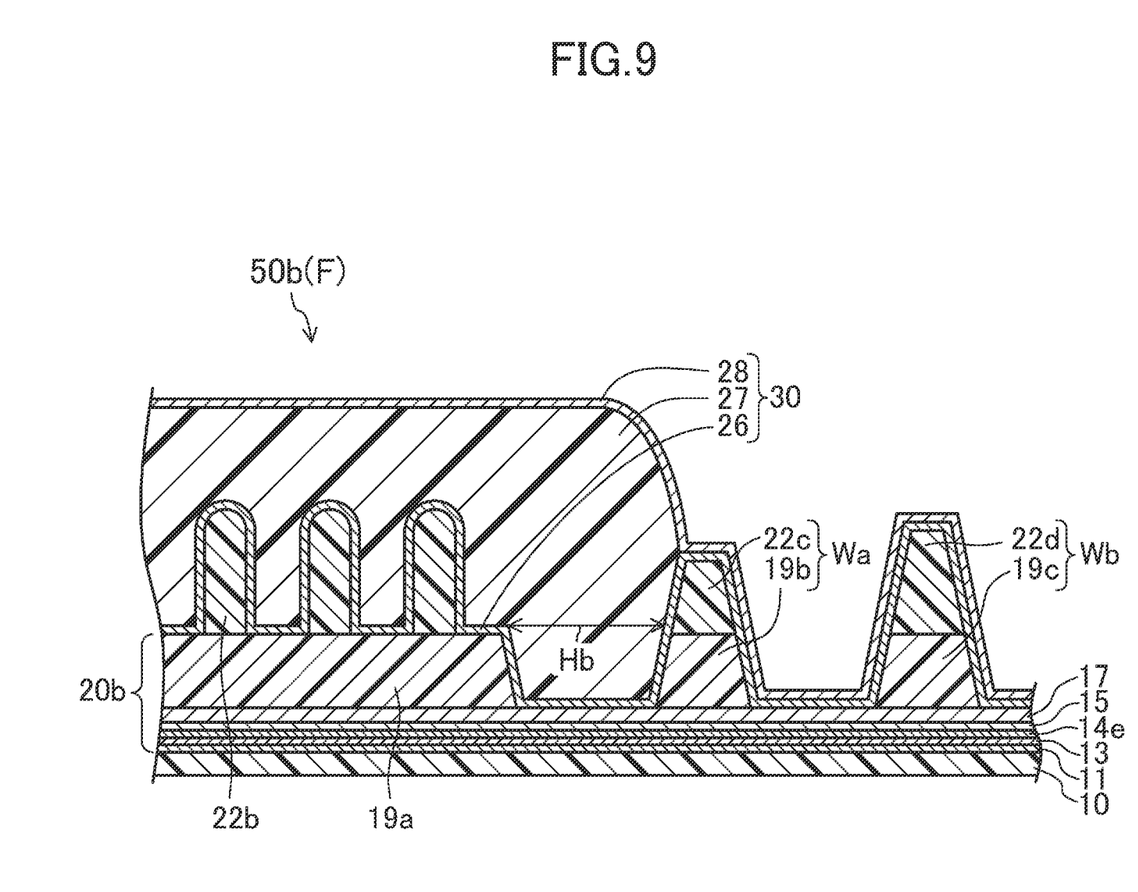
FIG. 9, corresponding to FIG. 7, is a cross-sectional view of an OLED display device in accordance with a second embodiment.

FIG. 9 illustrates a second embodiment of the display device and the method of manufacturing the display device. FIG. 9, corresponding to FIG. 7, is a cross-sectional view of an OLED display device 50b in accordance with the present embodiment. Members of the following embodiment(s) that are the same as those shown in FIGS. 1 to 8 are indicated by the same reference signs or numerals, and detailed description thereof is omitted.

The OLED display device 50a in accordance with the first embodiment has the first opening Ma and the second opening Mb thereof formed along all the four sides of the display area D. In contrast, the OLED display device 50b has the first opening Ma and the second opening Mb thereof formed along three sides of the display area D.

Similarly to the OLED display device 50a in accordance with the first embodiment, the OLED display device 50b has a display area D and a frame area F surrounding the display area D.

The OLED display device 50b, as shown in FIG. 9, includes a resin substrate layer 10, a TFT layer 20b on the resin substrate layer 10, OLEDs 25 (see FIG. 3) on the TFT layer 20b, and a sealing film 30 provided so as to cover the OLEDs 25. The OLEDs 25 form the display area D.

The TFT layer 20b includes: a base coat film 11 on the resin substrate layer 10; a plurality of first TFTs 9a (see FIG. 3), a plurality of second TFTs 9b (see FIG. 3), and a plurality of capacitors 9c (see FIG. 3) on the base coat film 11; and a second planarization film 19a on the first TFTs 9a, the second TFTs 9b, and the capacitors 9c, as shown in FIG. 9. The TFT layer 20b has essentially the same structure in the display area D as does the TFT layer 20a in accordance with the first embodiment.

The OLED display device 50b includes in the frame area F: a frame-shaped, first damming wall Wa provided so as to surround the display area D and to overlap a peripheral portion of the organic film 27 in the sealing film 30; and a frame-shaped, second damming wall Wb around the first damming wall Wa, as shown in FIG. 9.

The first opening Ma and the second opening Mb are provided between the display area D and the first damming wall Wa along the three sides of the display area D that do not face the terminal section T through the gate insulation film 13, the first interlayer insulation film 15, and the second interlayer insulation film 17 (see FIG. 6). The organic film 27 in the sealing film 30 is provided so as to fill in the inside of the first opening Ma along these three sides (see FIG. 6).

Neither the first opening Ma nor the second opening Mb is provided through the gate insulation film 13, the first interlayer insulation film 15, and the second interlayer insulation film 17 along the side of the display area D that faces the terminal section T between the display area D and the first damming wall Wa as shown in FIG. 9. The second interlayer insulation film 17 is in contact with the first inorganic film 26 along the side facing the terminal section T between the display area D and the first damming wall Wa and between the first damming wall Wa and the second damming wall Wb as shown in FIG. 9. The display area D is separated from the first damming wall Wa by a distance Hb (see FIG. 9) along the one of the sides of the frame area F that faces the terminal section T and by a distance Ha (see FIG. 6) along the three sides of the frame area F that do not face the terminal section T. The distance Hb is greater than the distance Ha. The present embodiment discusses an example where the distance Hb separating the display area D from the first damming wall Wa along the side of the frame area F facing the terminal section T is greater than the distance Ha separating the display area D from the first damming wall Wa along the three sides of the frame area F not facing the terminal section T. The distance Hb may alternatively be equal to the distance Ha. The distance Hb is however preferably greater than the distance Ha as in the present embodiment because this particular structure can increase the amount of the ink dammed up between the display area D and the first damming wall Wa (fill amount).

The OLED display device 50b includes a plurality of routing lines 14e extending parallel to each other in a direction perpendicular to the first damming wall Wa and the second damming wall Wb along the side of the frame area F facing the terminal section T as shown in FIG. 9. The routing lines 14e are electrically connected to respective source lines 18f. The routing lines 14e are also connected to the terminals E of the terminal section T via, for example, the routing lines 18j residing in the bending portion B. In other words, the source lines 18f are electrically connected to the terminals E via the routing lines 14e respectively. The routing lines 14e are made of the same material and in the same layer as, for example, the gate lines 14.

Similarly to the OLED display device 50a in accordance with the first embodiment above, the OLED display device 50b is flexible and is arranged, in each subpixel P, to cause a light-emitting layer 3 in an organic light-emitting layer 23 to emit light in a suitable manner via the first TFT 9a and the second TFT 9b, to produce an image display.

The OLED display device 50b in accordance with the present embodiment can be manufactured by the same method as the method of manufacturing the OLED display device 50a described in the first embodiment, except that the pattern for the first opening Ma and the second opening Mb is changed and the routing lines 14e are formed simultaneously with the gate lines 14 instead of the routing lines 18i being formed simultaneously with the source lines 18f.

As described in the foregoing, according to the OLED display device 50b and the method of manufacturing the OLED display device 50b in accordance with the present embodiment, the upwardly open, first opening Ma is formed through the gate insulation film 13, the first interlayer insulation film 15, and the second interlayer insulation film 17 in the TFT layer 20b between the display area D and the first damming wall Wa, and the organic film 27 in the sealing film 30 is provided so as to fill in the inside of the first opening Ma. This particular structure increases the amount of the ink dammed up by the first damming wall Wa to form the organic film 27 by as much as the volume of the first opening Ma. The structure hence restrains the frame area F from increasing in width and improves the ink-damming effect of the first damming wall Wa.

Additionally, according to the OLED display device 50b and the method of manufacturing the OLED display device 50b in accordance with the present embodiment, the upwardly open, second opening Mb is formed through the gate insulation film 13, the first interlayer insulation film 15, and the second interlayer insulation film 17 in the TFT layer 20b between the first damming wall Wa and the second damming wall Wb. This particular structure increases the amount of the ink dammed up by the second damming wall Wb to form the organic film 27 by as much as the volume of the second opening Mb. The structure hence improves the ink-damming effect of the second damming wall Wb.

In addition, according to the OLED display device 50b and the method of manufacturing the OLED display device 50b in accordance with the present embodiment, the first opening Ma and the second opening Mb are provided, which unfailingly delivers the ink-damming effect thereof even when the heights of the first damming wall Wa and the second damming wall Wb are smaller than the heights of the peripheral photo spacers 22b and the pixel photo spacers C. This particular structure hence allows reductions in the heights of the peripheral photo spacers 22b and the pixel photo spacers C while ensuring the ink-damming effect of the first opening Ma and the second opening Mb. The structure can therefore readily improve vapor deposition precision, that is, precision of the formation of, for example, the light-emitting layer 3.

Meanwhile, according to the OLED display device 50b and the method of manufacturing the OLED display device 50b in accordance with the present embodiment, the first damming wall Wa and the second damming wall Wb are lower than the peripheral photo spacers 22b and the pixel photo spacers C with which the vapor deposition mask comes into contact in the formation of, for example, the light-emitting layer 3. This particular structure prevents the vapor deposition mask from coming into contact with the first damming wall Wa and the second damming wall Wb, thereby reducing the generation of, for example, foreign objects caused by the contact.

Furthermore, according to the OLED display device 50b and the method of manufacturing the OLED display device 50b in accordance with the present embodiment, the first opening Ma and the second opening Mb expose the base coat film 11, and the base coat film 11 is in contact with the first inorganic film 26 in the sealing film 30 via the first opening Ma and the second opening Mb. This particular structure ensures that the sealing film 30 can achieve the sealing capability thereof in the first opening Ma and the second opening Mb, thereby restraining degradation of the OLEDs 25.

Additionally, according to the OLED display device 50b and the method of manufacturing the OLED display device 50b in accordance with the present embodiment, the distance Hb, by which the display area D is separated from the first damming wall Wa along the one of the sides of the frame area F that faces the terminal section T, is greater than the distance Ha, by which the display area D is separated from the first damming wall Wa along the three sides of the frame area F that do not face the terminal section T. This particular structure increases the amount of the ink dammed up by the first damming wall Wa by as much as the contribution from the increased distance between the display area D and the first damming wall Wa even when neither the first opening Ma nor the second opening Mb is provided through the gate insulation film 13, the first interlayer insulation film 15, and the second interlayer insulation film 17 in the TFT layer 20b along the one of the sides of the frame area F that faces the terminal section T.

Other Embodiments

The embodiments have so far discussed examples where the organic light-emitting layer has a 5-layer structure that includes a hole injection layer, a hole transport layer, a light-emitting layer, an electron transport layer, and an electron injection layer. Alternatively, the organic light-emitting layer may have, for example, a 3-layer structure that includes a hole injection and transport layer, a light-emitting layer, and an electron transport and injection layer.

The embodiments have so far discussed examples where the OLED display device includes the first electrodes serving as anodes and the second electrodes serving as cathodes. The disclosure is also applicable to OLED display devices in which the layer structure of the organic light-emitting layer is reversed so that the first electrodes serve as cathodes and the second electrodes serve as anodes.

The embodiments have so far discussed an exemplary OLED display device where the electrode of the TFT connected to the first electrode serves as a drain electrode. The disclosure is also applicable to OLED display devices where the electrode of the TFT connected to the first electrode serves as a source electrode.

The embodiments have so far discussed the OLED display device as an exemplary display device. The disclosure is applicable to any display device including a plurality of current-driven light-emitting elements, for instance, applicable to display devices including QLEDs (quantum-dot light-emitting diodes) which are light-emitting elements including a quantum dot layer.

INDUSTRIAL APPLICABILITY

As described above, the disclosure is useful in flexible display devices.

The invention claimed is:

1. A display device comprising:
   a base substrate;
   a thin-film transistor (TFT) layer on the base substrate, the TFT layer including at least one inorganic insulation film and at least one planarization film stacked in this order;
   light-emitting elements on the TFT layer, the light-emitting elements at least partially forming a display area;
   a sealing film provided so as to cover the light-emitting elements and including a first inorganic film, an organic film, and a second inorganic film stacked in this order;
   a first damming wall in a frame area around the display area, the first damming wall surrounding the display area and overlapping a peripheral portion of the organic film; and
   a second damming wall around the first damming wall, wherein
   the at least one inorganic insulation film has a first opening, which is upwardly open, at least in a part of an area between the display area and the first damming wall,
   the at least one inorganic insulation film further has a second opening, which is upwardly open, at least in a part of an area between the first damming wall and the second damming wall, and
   the organic film is provided so as to fill in the first opening.

2. The display device according to claim 1, wherein
   the at least one inorganic insulation film includes a base coat film on the base substrate,
   the first opening and the second opening are provided so as to expose the base coat film, and
   the base coat film is in contact with the first inorganic film in the first opening and the second opening.

3. The display device according to claim 1, wherein the first opening is provided to act as a frame surrounding the display area.

4. The display device according to claim 1, wherein the at least one inorganic insulation film includes a gate insulation film.

5. The display device according to claim 1, wherein the light-emitting elements are organic light-emitting diodes (OLEDs).

6. The display device according to claim 1, further comprising a terminal section with a plurality of terminals along a side of the frame area, wherein
   the display area is rectangular, and
   the at least one inorganic insulation film is in contact with the first inorganic film along a side of the frame area that faces the terminal section between the display area and the first damming wall and between the first damming wall and the second damming wall.

7. The display device according to claim 6, wherein
   the TFT layer further includes a plurality of parallel gate lines and a plurality of parallel source lines both in the display area, the plurality of parallel source lines crossing the plurality of parallel gate lines with the at least one inorganic insulation film intervening therebetween, and
   each of the plurality of parallel source lines is electrically connected to an associated one of the plurality of terminals via a routing line made of a same material and in a same layer as the plurality of parallel gate lines on the side of the frame area that faces the terminal section.

8. The display device according to claim 6, wherein the display area is separated from the first damming wall by a first distance along the side of the frame area that faces the terminal section and by a second distance along other sides of the frame area that do not face the terminal section, the first distance being greater than the second distance.

9. A display device comprising:
   a base substrate;
   a thin-film transistor (TFT) layer on the base substrate, the TFT layer including at least one inorganic insulation film and at least one planarization film stacked in this order;
   light-emitting elements on the TFT layer, the light-emitting elements at least partially forming a display area;
   a sealing film provided so as to cover the light-emitting elements and including a first inorganic film, an organic film, and a second inorganic film stacked in this order;
   a first damming wall in a frame area around the display area, the first damming wall surrounding the display area and overlapping a peripheral portion of the organic film; and
   a terminal section with a plurality of terminals along a side of the frame area, wherein
   the at least one inorganic insulation film has a first opening, which is upwardly open, at least in a part of an area between the display area and the first damming wall, the organic film is provided so as to fill in the first opening, the first opening is provided to act as a frame surrounding the display area, the display area is rectangular, the TFT layer further includes a plurality of parallel gate lines and a plurality of parallel source lines both in the display area, the plurality of parallel source lines crossing the plurality of parallel gate lines with the at least one inorganic insulation film intervening therebetween, and each of the plurality of parallel source lines is electrically connected to an associated one of the plurality of terminals via a routing line made of a same material and in a same layer as the plurality of parallel source lines on a side of the first opening that faces the terminal section.

10. The display device according to claim 9, wherein
the at least one inorganic insulation film includes a base coat film on the base substrate, the first opening is provided so as to expose the base coat film, and the routing line is in contact with the base coat film and the first inorganic film on the side of the first opening that faces the terminal section.

11. The display device according to claim 9, wherein at least one inorganic insulation film includes a gate insulation film.

12. The display device according to claim 9, wherein the light-emitting elements are organic light-emitting diodes (OLEDs).

13. A display device comprising:
a base substrate;
a thin-film transistor (TFT) layer on the base substrate, the TFT layer including at least one inorganic insulation film and at least one planarization film stacked in this order;
light-emitting elements on the TFT layer, the light-emitting elements at least partially forming a display area;

a sealing film provided so as to cover the light-emitting elements and including a first inorganic film, an organic film, and a second inorganic film stacked in this order;

a first damming wall in a frame area around the display area, the first damming wall surrounding the display area and overlapping a peripheral portion of the organic film; and a plurality of insular peripheral photo spacers between the display area and the first damming wall, wherein the at least one inorganic insulation film has a first opening, which is upwardly open, at least in a part of an area between the display area and the first damming wall, the organic film is provided so as to fill in the first opening, the plurality of insular peripheral photo spacers has a greater height above a surface of the base substrate than the first damming wall, the plurality of insular peripheral photo spacers is made of a same material and in a same layer as an overlying side of the first damming wall, the light-emitting elements include:
pixel electrodes arranged in a matrix on the TFT layer; and
an edge cover provided so as to cover a peripheral portion of each of the pixel electrodes, and the plurality of insular peripheral photo spacers, the overlying side of the first damming wall, and the edge cover are made of the same material and in the same layer.

14. The display device according to claim 13, wherein the at least one inorganic insulation film includes a gate insulation film.

15. The display device according to claim 13, wherein the light-emitting elements are organic light-emitting diodes (OLEDs).

* * * * *